United States Patent
Sugibayashi (10) Patent No.: US 6,526,541 B2
(45) Date of Patent: Feb. 25, 2003

(54) LIBRARY FOR USE IN DESIGNING A SEMICONDUCTOR DEVICE

(75) Inventor: Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/873,708

(22) Filed: Jun. 4, 2001

(65) Prior Publication Data

US 2001/0049810 A1 Dec. 6, 2001

(30) Foreign Application Priority Data

Jun. 6, 2000 (JP) ........................................ 2000-169315

(51) Int. Cl.$^7$ ............................................... G06F 17/50
(52) U.S. Cl. ............................................... 716/1; 716/6
(58) Field of Search ............................... 716/1, 2, 5, 6, 716/13, 14

(56) References Cited

U.S. PATENT DOCUMENTS

| | | | | |
|---|---|---|---|---|
| 5,636,372 A | * | 6/1997 | Hathaway et al. | 713/500 |
| 5,663,889 A | * | 9/1997 | Wakita | 716/6 |
| 6,240,541 B1 | * | 5/2001 | Yasuda et al. | 716/6 |
| 6,313,666 B1 | * | 11/2001 | Yamashita et al. | 326/113 |
| 6,396,307 B1 | * | 5/2002 | Kawakami et al. | 326/121 |

FOREIGN PATENT DOCUMENTS

JP 08-161389 6/1996

OTHER PUBLICATIONS

"Design of CMOS USLI" edited Tetsuya Iizuka, Published by Baifu Kan, pp. 149–150.

* cited by examiner

*Primary Examiner*—Son Mai
(74) *Attorney, Agent, or Firm*—Katten Muchin Zavis Rosenman

(57) ABSTRACT

For use in designing a logic circuit of a semiconductor device, a library (10) memorizes not only a delay value (TYP, MIN, or MAX) for each of signal paths of a circuit element of the logic circuit but also a standard deviation ($\sigma_{CHIP}$ or $\sigma_{TR}$) of a variation of the delay value for each of the signal paths of the circuit element. Instead of the standard deviation, the library may memorize a variance of the variation. The variance is given by $(\sigma_{CHIP})^2$ or $(\sigma_{TR})^2$ when the variation is a normal distribution.

16 Claims, 10 Drawing Sheets

| SIGNAL PATH | TRANSITION DIRECTION | INTERNAL DELAY (ns) | | | | | LOAD DELAY (ns/pF) | | | | |
|---|---|---|---|---|---|---|---|---|---|---|---|
| | | MIN | TYP | MAX | $\sigma_{TR}$ | $\sigma_{CHIP}$ | MIN | TYP | MAX | $\sigma_{TR}$ | $\sigma_{CHIP}$ |
| IN0→OUT | High→Low | 0.15 | 0.2 | 0.3 | 0.01 | $0.20 * e^{-20/r}$ | 1.5 | 2 | 3 | 0.1 | $2.0 * e^{-20/r}$ |
| | Low→High | 0.16 | 0.22 | 0.34 | 0.01 | $0.22 * e^{-20/r}$ | 1.6 | 2.2 | 3.4 | 0.1 | $2.2 * e^{-20/r}$ |
| IN1→OUT | High→Low | 0.17 | 0.24 | 0.38 | 0.01 | $0.24 * e^{-20/r}$ | 1.7 | 2.4 | 3.8 | 0.1 | $2.4 * e^{-20/r}$ |
| | Low→High | 0.18 | 0.26 | 0.44 | 0.01 | $0.26 * e^{-20/r}$ | 1.8 | 2.6 | 4.4 | 0.1 | $2.6 * e^{-20/r}$ |

FIG. 1
PRIOR ART

```
(module myAO(A,B,C,E,CLK);
input A,B,C,CLK;
output E;
reg E;
always @(risedge CLK) E<=(A&B)IC;
endmodule
```

| SIGNAL PATH | TRANSITION DIRECTION | INTERNAL DELAY (ns) | | | | | LOAD DELAY (ns/pF) | | | | |
|---|---|---|---|---|---|---|---|---|---|---|---|
| | | MIN | TYP | MAX | $\sigma_{TR}$ | $\sigma_{CHIP}$ | MIN | TYP | MAX | $\sigma_{TR}$ | $\sigma_{CHIP}$ |
| IN0→OUT | High→Low | 0.15 | 0.2 | 0.3 | 0.01 | $0.20*e^{-20/r}$ | 1.5 | 2 | 3 | 0.1 | $2.0*e^{-20/r}$ |
| IN0→OUT | Low→High | 0.16 | 0.22 | 0.34 | 0.01 | $0.22*e^{-20/r}$ | 1.6 | 2.2 | 3.4 | 0.1 | $2.2*e^{-20/r}$ |
| IN1→OUT | High→Low | 0.17 | 0.24 | 0.38 | 0.01 | $0.24*e^{-20/r}$ | 1.7 | 2.4 | 3.8 | 0.1 | $2.4*e^{-20/r}$ |
| IN1→OUT | Low→High | 0.18 | 0.26 | 0.44 | 0.01 | $0.26*e^{-20/r}$ | 1.8 | 2.6 | 4.4 | 0.1 | $2.6*e^{-20/r}$ |

FIG. 8

$$P_{CIR}(t) = 1/M \cdot \sum_k [(1-G_k(t, \sum_i TPD_{gate}(i,k) + m \cdot \sum_i \sigma_{CHIP}(Rw,i,k), \sqrt{\sum_i \sigma_{TR}^2(i,k)})) \cdot$$

$$\prod_{j=k} G_j(t, \sum_i TPD_{gate}(i,j) + m \cdot \sum_i \sigma_{CHIP}(Rw,i,j), \sqrt{\sum_i \sigma_{TR}^2(i,j)})]$$

$P_{CIR}(t)$: probability density function of a delay time t of the circuit
M: the number of signal paths in the circuit
Rw: parameter corresponding to wafer size
$TPD_{gate}(i,j)$: average of delay values for j-th signal path of i-th circuit element
$\sigma_{CHIP}(r,i,j)$: standard deviation of position dependent component of variation of delay values for j-th signal path of i-th circuit element
$\sigma_{TR}(i,j)$: standard deviation of random component of variation of delay values for j-th signal path of i-th circuit element
Gj(x,y,z): accumulation function of accumulating average y and standard deviation z for j-th signal path to x of normal distribution
n,m: parameters determined depending upon a required yield of circuit to be synthesized

FIG. 10B $$\left| TPD_{path}(j) - TPD_{path}(k) \right| =$$

$$\left| \sum_i TPD_{gate}(i,j) - \sum_i TPD_{gate}(i,k) \right| + m^+ \cdot \left( \sum_i \sigma_{CHIP}(r,i,j) + \sum_i \sigma_{CHIP}(r,i,k) \right) +$$

$$n^+ \cdot \sqrt{\sum_i (\sigma_{TR}^2(i,j) + \sigma_{TR}^2(i,k))}$$

r: length of one side of occupied region of circuit to be synthesized
$TPD_{path}(j)$: delay value for j-th signal path
$n^+, m^+$: parameters determined depending upon required yield of circuit to be synthesized

FIG. 11

$$TPD_{path}(j) = \sum_i TPD_{gate}(i,j) + m^{++} \cdot \sum_i \sigma_{CHIP}(Rw,i,j) + n^{++} \cdot \sqrt{\sum_i \sigma_{TR}^2(i,j)}$$

$n^{++}, m^{++}$: parameters determined depending upon required yield of circuit to be synthesized

FIG. 12

$$W_{j,k} = \sum_{n=0}^{N-1} f[n] \, \phi_{j,k}[n]$$

$W_{j,k}$: k-th wavelet coefficient of level j
f[n]: original function
$\phi_{j,k}[n]$: wavelet function, N: number of data

FIG. 13

$$\phi[x] = \begin{cases} 1 & (0 < x < 1/2) \\ -1 & (1/2 < x < 1) \\ 0 & (\text{elsewhere}) \end{cases}$$

$$\sqrt{(1/M_j) \cdot \sum_k V_{j,k}{}^2} \propto 2^{-j}$$

$V_{j,k}$: remaining wavelet coefficients after separation $M_j$: the number of wavelet coefficient of transform level j

MEASURED VALUE

FIG. 19A

☐ △Vtp > +40mV
▨ △Vtp > +20mV
▨ △Vtp > 0mV
▧ △Vtp > -20mV
▨ -20mV ≧ △Vtp

RESTRUCTURED BY THE USE OF
UPPER 8% WAVELET COEFFICIENTS

FIG. 19B $$\sigma_{CHIP}(r) = A \cdot \exp(-B/r)$$

A,B: parameters r: one side of chip size

FIG. 20

$$\sigma_{CHIP}(R \cdot 2^L) = \sum_{j=0}^{L} \left( \sqrt{(1/M_j) \cdot \sum_k V_{j,k}^2} \right)$$

L: parameter representing a particular level

R: size of one side of test chip

LIBRARY FOR USE IN DESIGNING A SEMICONDUCTOR DEVICE

BACKGROUND OF THE INVENTION

This invention relates to a structure of a library used in circuit design of a semiconductor device.

Japanese Unexamined Patent Publication (A) No. H08-161389 discloses a method of calculating a delay time in signal transmission from an output terminal of a circuit cell to a branch node connected to the output terminal. Specifically, the method comprises the steps of obtaining a wire length from the output terminal of the circuit cell to each branch node connected to the output terminal, obtaining a total tree length of a tree forming an RC net (resistance-capacitance network) connected to the output terminal, calculating a ratio $R_W$ between the wire length and the total tree length, and calculating the delay time by the use of the ratio $R_W$ and the total tree length. In this case, the delay time is accurately calculated by calculating a variance $V(R_W)$ of $R_W$ or by clustering $R_W$ by the use of a standard deviation $\sigma$ of $R_W$.

This invention relates to a library which is used in designing a logic circuit of a semiconductor device and which memorizes a delay value for each signal path of a circuit element of the logic circuit. As will later be described with reference to the drawing, the circuit element of the logic circuit is, for example, a unit logic gate having a plurality of inputs and a single output. The delay value for each signal path of the circuit element is different in object of delay calculation from the delay time on a wire from the output terminal of the circuit cell to the branch node connected to the output terminal in the above-mentioned publication. The above-mentioned publication does not disclose such library used in designing the logic circuit of the semiconductor device, such delay value for each signal path of the circuit element of the logic circuit, and any information related to the delay value.

Figure 1:
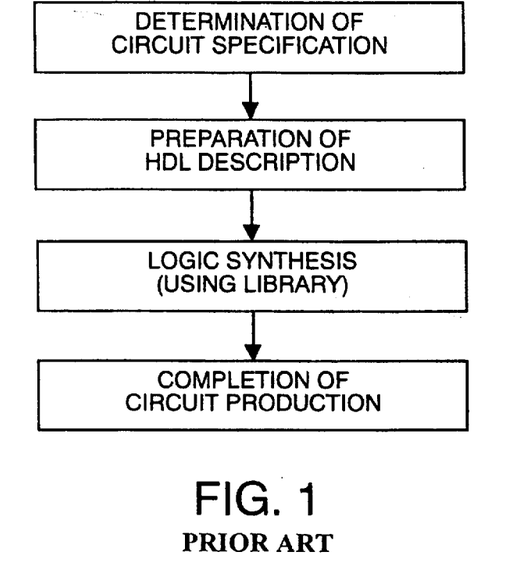
FIG. 1 shows a process of designing a logic circuit.

A logic LSI or a logic circuit at a signal processing part of a memory LSI is produced by the steps illustrated in FIG. 1 by the use of logic synthesis software. A technique of designing the logic circuit will presently be described.

Figure 2:
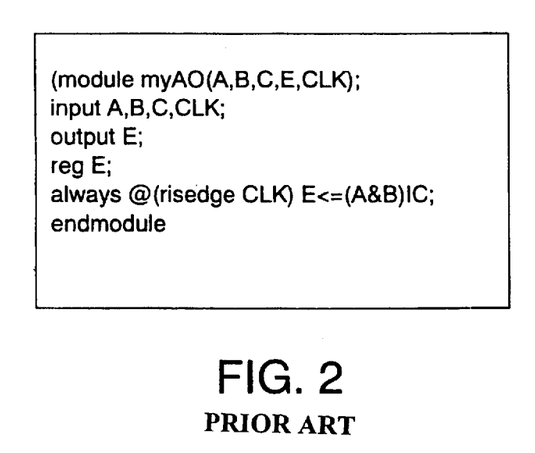
FIG. 2 shows an example of description of a circuit function by Verilog-HDL.
Figure 3:
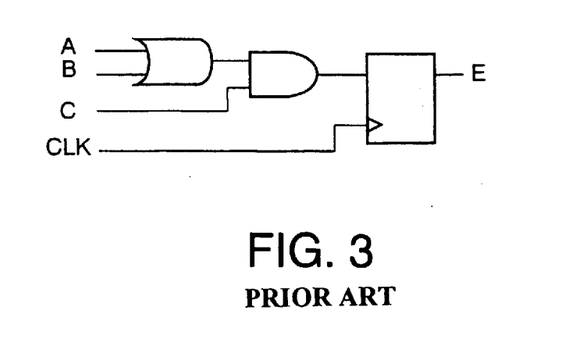
FIG. 3 shows an example of a circuit obtained by logic synthesis from the description illustrated in FIG. 2.

A designer of the logic LSI describes a circuit function for realizing a circuit specification by the use of a hardware description language (HDL) such as Verilog-HDL. Referring to FIG. 2, the circuit function is described by Verilog-HDL. Referring to FIG. 3, the circuit having the circuit function described by the HDL is logically synthesized using circuit elements registered in the library.

The library comprises circuit elements including fundamental logic gates such as a NAND gate and macroscopic elements, such as a register and an adder, having fundamental functions. The logic synthesis software selects desired circuit elements from the library and synthesizes the circuit having the circuit function described by the HDL. The logic synthesis not only realizes the circuit function or logic described by the HDL but also optimizes a circuit velocity, a circuit area, and the like.

Figure 4:
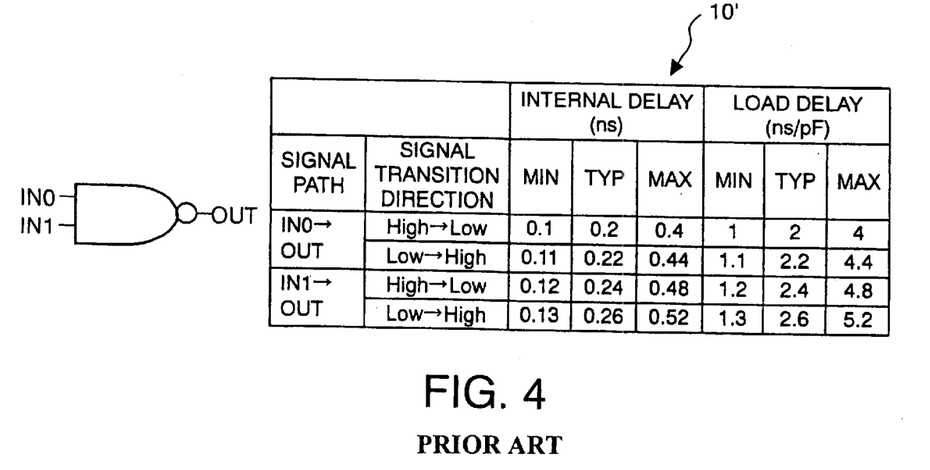
FIG. 4 shows a conventional library memorizing a NAND gate and information related to delay values of the NAND gate.

Referring to FIG. 4, a conventional library 10' used in the logic synthesis software includes a NAND gate and a part describing delay values of the NAND gate. The library 10' memorizes a minimum delay MIN as a best value, a typical delay TYP as a moderate value, and a maximum delay MAX as a worst value for each signal path of the NAND gate. Thus, the delay values in the velocity of each circuit element are determined depending upon a load condition. When the logic synthesis software is executed to select the desired circuit elements which satisfy the logic described by the HDL, the logic synthesis software can be set to select those circuit elements such that a minimum delay time is achieved.

Figure 5:
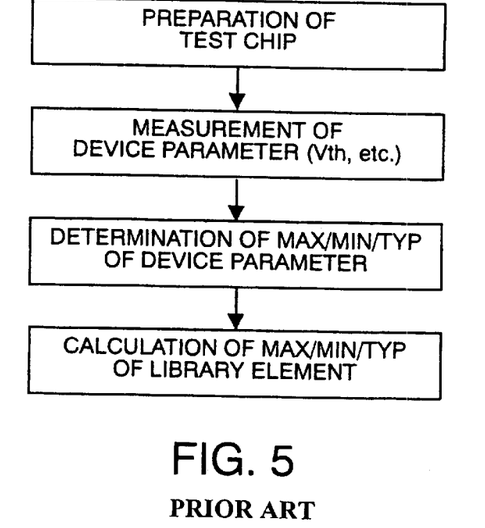
FIG. 5 shows a process of preparing the library.

Referring to FIG. 5, preparation of the library will be described. A test chip is produced and subjected to measurement of a device parameter such as a transistor threshold level (Vth). From the distribution of the device parameter, the maximum value (MAX), the minimum value ((MIN), and the typical value (TYP) of the device parameter are determined. Through circuit simulation based on these values, the maximum value (MAX), the minimum value (MIN), and the typical value (TYP) are determined for the delay values of the circuit element. These values thus determined are memorized in the library.

On the other hand, the circuit element has a predetermined area. Therefore, it is possible to execute the logic synthesis software with a setting such that a circuit area is minimized instead of a signal delay time of the circuit.

In the conventional circuit design described above, the variation in delay value of the circuit element is contained in the library as the minimum value and the maximum value. In most cases, the maximum value is set so that the probability of occurrence of a greater delay is about 0.1% or less. Such setting is generally called "3σ". This is because, in normal distribution of Gaussian distribution, a deviation from an average is equal to or greater than three times a standard deviation σ at a probability of 0.1% or less.

However, the variation in delay value of the circuit element is assumed to be an independent event. Then, consecutive appearance of those circuit elements (for example, gates) having the maximum values is rare. If a large number of stages of circuit elements are contained upon the logic synthesis, evaluation is inclined to a greater delay than that actually obtained at a certain probability when the LSI is produced.

Figure 6:
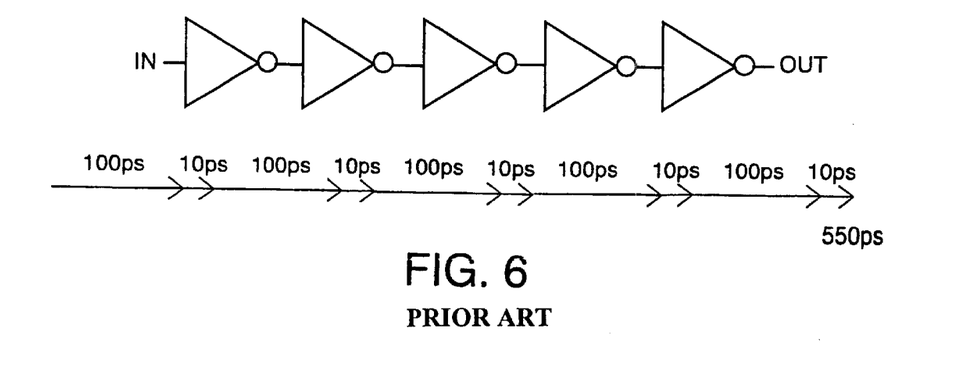
FIG. 6 is a view for describing calculation of delay values for a signal path by the use of the conventional library.

Referring to FIG. 6, a five-stage inverter circuit will be described by way of example. In the illustrated example, an average delay for each stage and 3σ are assumed to be equal to 100 ps and 10 ps, respectively. Assuming that the variation in delay value of each inverter has a normal distribution and is completely independent of that of any other inverter, the total distribution as a sum of the normal distributions of such independent events has a variance which can be represented by a sum of variances of the distributions. By the use of 3σ values registered in the library as the maximum values, the maximum value in delay value of the inverter circuit is estimated to be 550 ps. In the normal distribution, the variance is equal to a square of the standard deviation. Therefore, the variation of 50 ps is $\sqrt{5}$ times excessive estimation. This problem is pointed out in "Design of CMOS ULSI" edited by Tetsuya Iizuka, published by Baifu-kan, 1989, pp. 149–150.

In the conventional design technique, the independent variation in delay value of the signal path in each individual chip is considered by MIN, TYP, and MAX. However, no consideration is made about the independent variation in delay value of the signal path in each individual signal path in the LSI chip. Therefore, optimization of delay has been carried out by calculating a sum of the delay values defined in the library and by increasing the velocity of a slowest signal path. However, in the actual LSI, the variation in delay value of the signal path is independent in each individual path in the LSI chip. Therefore, the above-mentioned approach does not provide the optimization, as will presently be described. For convenience of description, each delay value is given by an integral multiple of 0.1 ns.

Figure 7A:
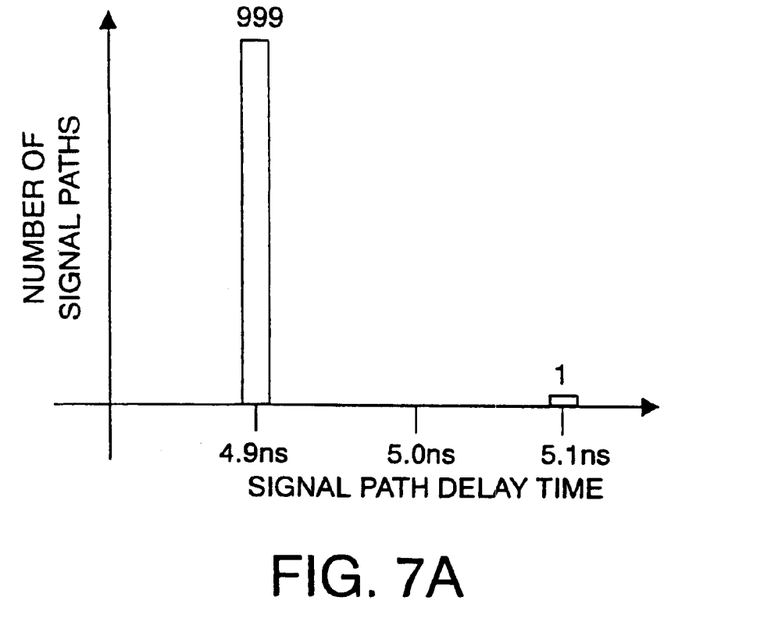
FIGS. 7A and 7B show distributions of the delay values for the signal path in circuit plans produced in logic synthesis software.
Figure 7B:
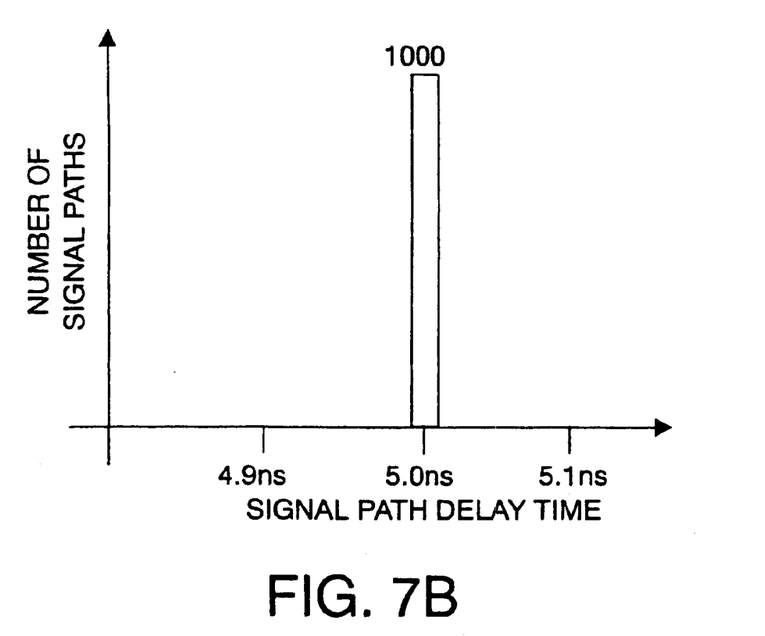

Referring to FIGS. 7A and 7B, it is assumed that a circuit having 1000 signal paths is synthesized by the logic synthesis software and that two circuit plans (a) and (b) are produced. Specifically, the plan (a) includes a single path having a delay of 5.1 ns and 999 paths having a delay of 4.9 ns while the plan (b) includes 1000 signal paths having a delay of 5.0 ns. In this event, the logic synthesis software selects the plan (a) as a best plan. However, if all of the signal paths have a variation of 0.2 ns as 3σ, at least one path has a delay of 5.2 ns in most of the semiconductor devices in case of the circuit of the plan (a). On the other hand, the circuit of the plan (b) will be operated with a delay of 5.1 ns in the half or more of the semiconductor devices.

The circuit of the plan (a) logically synthesized is not always an optimum circuit taking into account the large variation in delay value of the signal path across the LSI chip. In order to avoid such disadvantage, it is necessary to know the nature of the variation of the circuit elements of the semiconductor device across the chip. However, no appropriate method has been found yet. On the other hand, reduction in design rule of the semiconductor device brings about the increase in variation of the device parameter.

SUMMARY OF THE INVENTION

It is an object of this invention to provide a structure of a library used in logic synthesis software capable of producing an optimum logic for an actual semiconductor device having a variation.

It is an object of this invention to provide logic synthesis software capable of producing an optimum logic for an actual semiconductor device having a variation.

Other objects of this invention will become clear as the description proceeds.

Libraries according to this invention, computer-readable recording media according to this invention, and methods according to this invention are as follows:

(1) A library for use in designing a logic circuit of a semiconductor device, the logic circuit comprising a circuit element having signal paths, the library memorizing a delay value for each of the signal paths of the circuit element, wherein the library further memorizes a standard deviation of a variation of the delay value for each of the signal paths of the circuit element.

(2) A library as described in the paragraph (1), wherein the standard deviation of the variation of the delay value is a standard deviation of a position dependent component of the variation of the delay value for each of the signal paths of the circuit element, the position dependent component being dependent upon a position of the logic circuit within a wafer plane when the logic circuit is formed on the wafer plane as a result of logic synthesis.

(3) A library as described in the paragraph (2), wherein the standard deviation of the position dependent component of the variation of the-delay value is a standard deviation of the position dependent component dependent upon an occupied area of the logic circuit or a length of one side of the logic circuit when the logic circuit is formed on the wafer plane as a result of logic synthesis.

(4) A library as described in the paragraph (1), wherein the standard deviation of the variation of the delay value is a standard deviation of a random component of the variation of the delay value for each of the signal paths of the circuit element, the random dependent component being independent of a position of the logic circuit within a wafer plane when the logic circuit is formed on the wafer plane as a result of logic synthesis.

(5) A library for use in designing a logic circuit of a semiconductor device, the logic circuit comprising a circuit element having signal paths, the library memorizing a delay value for each of the signal paths of the circuit element, wherein the library further memorizes a variance of a variation of the delay value for each of the signal paths of the circuit element.

(6) A library as described in the paragraph (5), wherein the variance of the variation of the delay value is a variance of a position dependent component of the variation of the delay value for each of the signal paths of the circuit element, the position dependent component being dependent upon a position of the logic circuit within a wafer plane when the logic circuit is formed on the wafer plane as a result of logic synthesis.

(7) A library as described in the paragraph (6), wherein the variance of the position dependent component of the variation of the delay value is a variance of the position dependent component dependent upon an occupied area of the logic circuit or a length of one side of the logic circuit when the logic circuit is formed on the wafer plane as a result of logic synthesis.

(8) A library as described in the paragraph (5), wherein the variance of the variation of the delay value is a variance of a random component of the variation of the delay value for each of the signal paths of the circuit element, the random dependent component being independent of a position of the logic circuit within a wafer plane when the logic circuit is formed on the wafer plane as a result of logic synthesis.

(9) A computer-readable recording medium which records a library for use in designing a logic circuit of a semiconductor device, the logic circuit comprising a circuit element having signal paths, the library memorizing a delay value for each of the signal paths of the circuit element and a standard deviation of a variation of the delay value for each of the signal paths of the circuit element, the recording medium further recording a program for making a computer execute a logic synthesis operation in which logic synthesis of the logic circuit is carried out by the use of the library.

(10) A computer-readable recording medium which records a library for use in designing a logic circuit of a semiconductor device, the logic circuit comprising a circuit element having signal paths, the library memorizing a delay value for each of the signal paths of the circuit element and a variance of a variation of the delay value for each of the signal paths of the circuit element, the recording medium further recording a program for making a computer execute a logic synthesis operation in which logic synthesis of the logic circuit is carried out by the use of the library.

(11) A method of designing a semiconductor device, comprising the steps of:

preparing a library for use in designing a logic circuit of the semiconductor device, the logic circuit comprising a circuit element having signal paths, the library memorizing a delay value for each of the signal paths of the circuit element and a standard deviation of a variation of the delay value for each of the signal paths of the circuit element; and carrying out logic synthesis of the logic circuit by the use of the library.

(12) A method of designing a semiconductor device, comprising the steps of:

preparing a library for use in designing a logic circuit of the semiconductor device, the logic circuit comprising a circuit element having signal paths, the library memorizing a delay value for each of the signal paths of the circuit element and a variance of a variation of the delay value for each of the signal paths of the circuit element; and carrying out logic synthesis of the logic circuit by the use of the library.

The method may comprise the step of calculating the variance of the variation of the delay value for each signal path independent of an average of the delay values, multiplying the variance by a predetermined coefficient corresponding to a scheduled yield, adding a resultant product to a square root of the variance to produce a sum as a maximum value of the delay value of the signal path.

Alternatively, the method may comprise the step of calculating, with respect to a plurality of signal paths in a design unit to be subjected to logic synthesis, the variance of the variation of the delay values for each signal path independent of an average of the delay values, obtaining a distribution of the delay values for each signal path, preparing an evaluation function by a combination of the distributions of the delay values for the signal paths, and carrying out the optimization of logic synthesis on the basis of the evaluation function.

(13) A method of preparing a library for use in designing a logic circuit of the semiconductor device, the logic circuit comprising a circuit element having signal paths, the library memorizing a delay value for each of the signal paths of the circuit element, a first variance of a position dependent component of a variation of the delay value for each of the signal paths of the circuit element, and a second variance of a random component of the variation of the delay value for each of the signal paths of the circuit element, the position dependent component being dependent upon a position of the logic circuit within a wafer plane when the logic circuit is formed on the wafer plane as a result of logic synthesis, the random dependent component being independent of the position of the logic circuit within the wafer plane when the logic circuit is formed on the wafer plane as a result of logic synthesis, the method comprising the step of:

separating a device parameter of the semiconductor device to be designed into the position dependent component and the random component by wavelet transform to obtain the first and the second variances.

(14) A method as described in the paragraph (13), wherein separation of the device parameter into the position dependent component and the random component by the wavelet transform is carried out based on judgment utilizing transform level dependency of a wavelet coefficient.

(15) A method as described in the paragraph (14), wherein the wavelet transform is carried out by the use of the Haar function.

(16) A method as described in the paragraph (13), wherein the wavelet transform compensates data at an unmeasurable position with any one of an average of overall data and an average of neighborhood data.

The library according to this invention includes as one of elements the standard deviation or the variance of the random component of the variation of the delay values of the circuit element such as a unit logical gate. Therefore, even in the semiconductor device using a production process accompanied with a large variation, it is possible to design a circuit close to an optimum circuit.

The library according to this invention includes as one of elements the standard deviation or the variance of the position dependent component of the variation of the delay values of the circuit element which is dependent upon the area or the length of one side of an occupied region of the circuit element obtained as a result of logic synthesis. Therefore, particularly in an asynchronous circuit, it is possible to design a circuit close to an optimum circuit in an actual semiconductor device.

In the method of preparing the library, the device parameter, such as a transistor threshold value, used in circuit design is separated into the position dependent component and the random component by the use of the wavelet transform. Therefore, with respect to the variation of the device parameter resulting from a complicated semiconductor process, the variation can be decomposed in mode into different components.

In the semiconductor design software or the method of designing a semiconductor device according to this invention, the logic synthesis is performed by the use of the library containing the above-mentioned variation. Therefore, a circuit close to the optimum circuit in the actual semiconductor device can be obtained as a result of the logic synthesis.

In the method of designing a semiconductor device according to this invention, the variance of the delay values for each signal path is calculated independent of the average of the delay values. The variance is multiplied by the predetermined coefficient corresponding to the scheduled yield. The resultant product is added to the square root of the variance to obtain the sum as the maximum value of the delay values of the signal path. Therefore, it is possible to reduce the amount of calculation and to obtain a circuit close to the optimum circuit in the actual semiconductor device.

In the method of designing a semiconductor device according to this invention, the variance of the variation of the delay values for each signal path is calculated independent of the average of the delay values with respect to a plurality of signal paths in the design unit to be subjected to logic synthesis. The distribution of the delay values for each signal path is obtained. The evaluation function is prepared by a combination of the distributions of the delay values for the signal paths. The optimization of logic synthesis is performed on the basis of the evaluation function. Therefore, it is possible to obtain a circuit close to the optimum circuit more accurately.

In the method of preparing a library according to this invention, the position dependent component and the random component of the variation are separated based on the judgment utilizing the transform level dependency of the wavelet coefficient. Therefore, it is possible to determine a separation point more accurately.

In the method of preparing a library according to this invention, the Haar function is used as the wavelet transform. Therefore, it is possible to calculate the chip size dependency of the variation in the position dependent mode simultaneously when the variation is separated in mode into different components.

In the method of preparing a library according to this invention, the data at the unmeasurable position are compensated by the average upon the wavelet transform. Therefore, the wavelet transform can be carried out for data in a generally circular shape such as a wafer or data with a partial lack.

The semiconductor device designed by the use of the software according to this invention is higher in performance than the conventional semiconductor device. By the use of the semiconductor device, a high-performance system can be produced.

DETAILED DESCRIPTION OF THE DRAWING

FIG. 18 is a view for describing the level dependency of the [root] mean square of the wavelet coefficient in a portion corresponding to the random variation;

DESCRIPTION OF THE PREFERRED EMBODIMENTS

Now, embodiments of this invention will be described with reference to the drawing.

Figure 8:
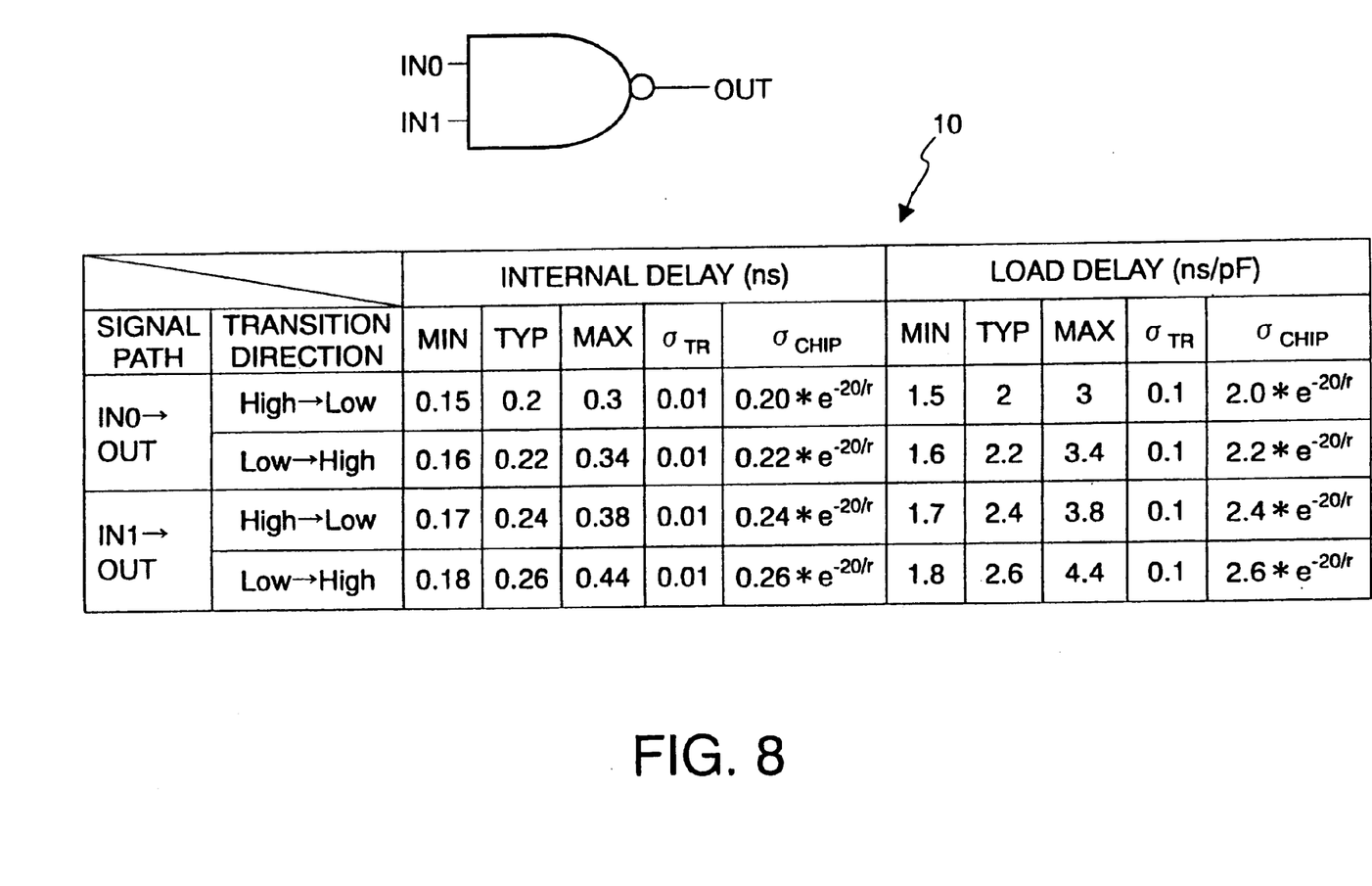
FIG. 8 is a view for describing a library according to this invention.

Referring to FIG. 8, a library 10 used in a semiconductor design software according to this invention is equivalent to that illustrated in FIG. 4 except that $\sigma_{TR}$ and $\sigma_{CHIP}$ are additionally memorized. Variation between silicon wafers or between lots is represented in the form of a minimum value (MIN), a maximum value (MAX), and a typical value (TYP).

A production process of a semiconductor device is not uniform across a wafer plane of a wafer. Therefore, the variation includes a position dependent component dependent upon a position in the wafer plane. The library 10 contains the position dependent component in the form of $\sigma_{CHIP}$. $\sigma_{CHIP}$ is a function (will later be given as a specific example) of a variable r which is the length of one side of an occupied region of a circuit prepared by the use of the library 10. The position dependent component of the variation becomes greater as the occupied region of the circuit becomes greater in area. Substitution of a wafer size to the variable r of $\sigma_{CHIP}$ provides a standard deviation of distribution when the circuit is [circuits are] formed throughout an entire surface of the wafer. On the other hand, a random component of the variation independent of the position in the wafer plane is represented by $\sigma_{TR}$.

In case where the variation has a normal distribution, the standard deviation is equal to $\sqrt{(variance)}$. Therefore, the library 10 in FIG. 8 may memorize the variance $(\sigma_{TR})^2$ and $(\sigma_{CHIP})^2$ instead of the standard deviations $\sigma_{TR}$ and $\sigma_{CHIP}$.

According to this invention, the library 10 illustrated in FIG. 8 is recorded in a computer-readable recording medium together with a program (logic synthesis software) for making a computer execute logic synthesis operation in which logic synthesis of a logic circuit is carried out by the use of the library 10 in FIG. 8.

Figure 9:
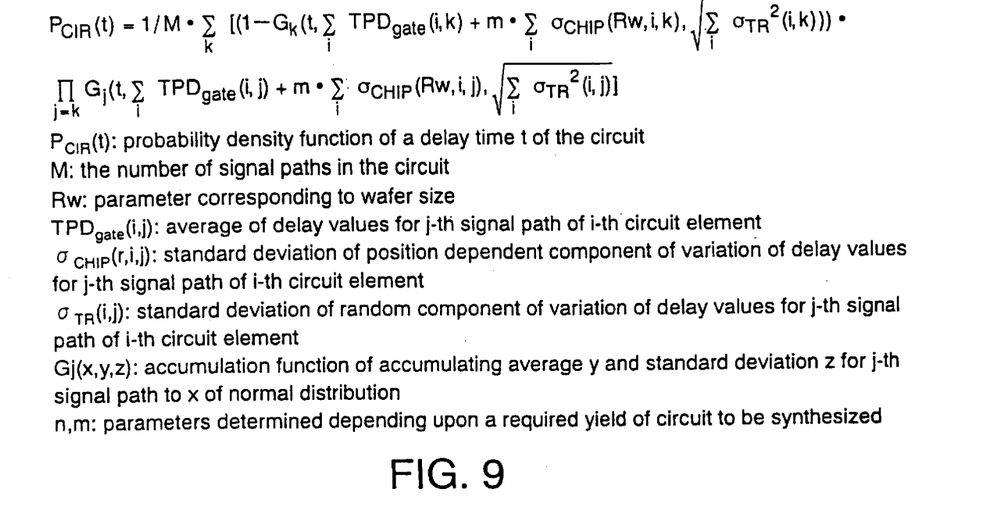
FIG. 9 shows an evaluation function in a logic synthesis program according to this invention.

In the logic synthesis software, the information ($\sigma_{TR}$ and $\sigma_{CHIP}$) added to the library 10 is used in the following manner. Referring to FIG. 9, an evaluation function illustrated in the figure is for use in the logic synthesis of a synchronous circuit. In this case, $\sigma_{CHIP}$ is used as a part of average values. For the average and the standard deviation $\sigma_{TR}$ of the random component of the variation, sums are separately calculated for each signal path to be used as distribution functions for each signal path (accumulation function of the distribution functions being $G_j(x, y, z)$ in FIG. 9). Multiplication by the probability that another path (Gj(t; ΣTPD+mΣσ, $\sqrt{(\Sigma\sigma)}$)) is faster than a particular path (1−Gj(t; ΣTPD+mΣ, $\sqrt{(\Sigma\sigma)}$)) and summation of resultant products provide the evaluation function for optimization of the circuit. The evaluation function $P_{CIR}(t)$ represents a probability density of t being a delay time of a slowest path among all paths.

Figure 10A:
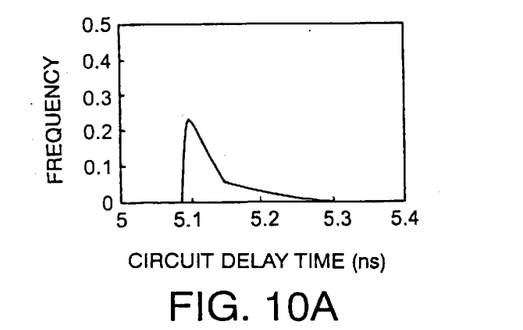
FIGS. 10A and 10B are views for describing a difference in evaluation function with respect to the circuit plans shown in FIGS. 7A and 7B, respectively.
Figure 10B:
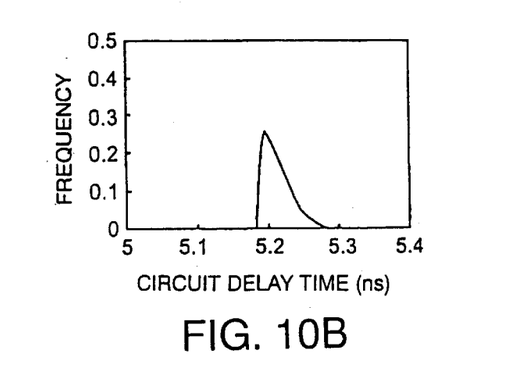

By way of example, the evaluation functions for the two circuit plans (a) and (b) shown in FIGS. 7A and 7B are plotted in FIGS. 10A and 10B, respectively. The probability of the delay time being 5.2 ns or less is equal to about 25% in the plan (b) and is equal to about 97% in the plan (a). Therefore, in the conventional logic synthesis software, the plan (a) is selected without any condition.

On the other hand, consideration will be made about the use of the logic synthesis software using the library of this invention. If the increase in velocity at an yield of 90% or more is set as the condition, the plan (a) is selected. To the contrary, if the circuit to be synthesized need not be fast as far as the delay time is 5.4 ns or less, the plan (b) is selected because the tail of the distribution is short and a higher yield is expected.

Figure 11:
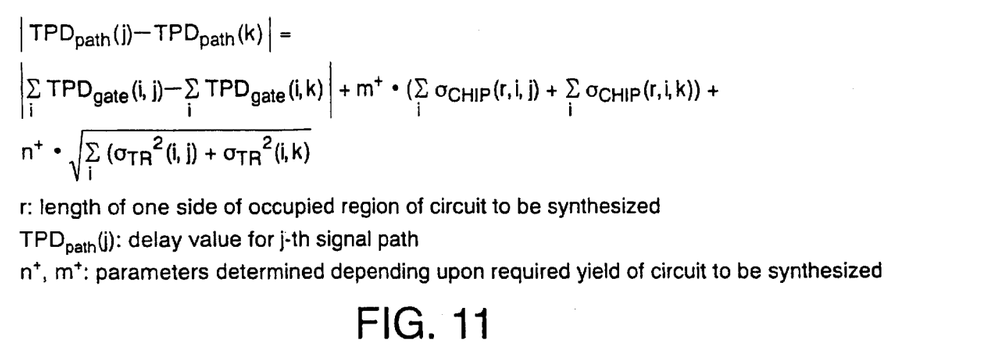
FIG. 11 shows a formula representing a difference between two signal paths in case where the library of this invention is applied to an asynchronous circuit.

In the synchronous circuit, the contents of the registers are synchronized by a reference clock. Therefore, no fault occurs in the circuit function irrespective of the order of arrival of signals from register to register. However, in an asynchronous circuit, if the order of propagation of signals is changed, the contents of the registers may possible be changed. Therefore, $\sigma_{CHIP}$ is considered as the variation. The asynchronous circuit is not designed by the use of the logic synthesis software. However, after production of the circuit, whether or not the order of the signals is maintained is sometimes checked by logical simulation using library elements. In this case, use can be made of $\sigma_{CHIP}$. Referring to FIG. 11, a difference between two signal paths is represented as illustrated in the figure.

Figure 12:
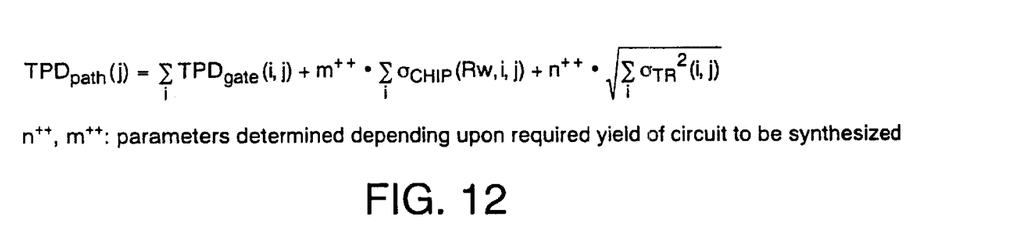
FIG. 12 shows another evaluation function in another logic synthesis program according to this invention.

It is time-consuming to accurately calculate the formula in FIG. 9 upon logic synthesis of the synchronous circuit. In view of the above, use may be made of a formula in another logic synthesis software according to this invention as illustrated in FIG. 12. This formula shows a calculation technique of a single path in case where, on the assumption that the number of signal paths is not so great as to affect the result of logic synthesis, the effect of the variation is introduced only into the calculation of each path and the results of calculation are compared with one another.

In order to represent the variation by numerical values for the purpose of introduction into the library, it is necessary to separate the components of the variation of the device parameter. However, since the semiconductor process is complicated and various factors are entangled, it is difficult to describe the position dependency by a simple function. Recently, use is made of the wavelet transform frequently used in image processing or signal processing. Specifically, by the use of the wavelet transform, the distribution data of the device parameter on the wafer are separated into the position dependent component (corresponding to an image in the image processing) and a single transistor variation component (corresponding to a noise in the image processing).

Figure 13:
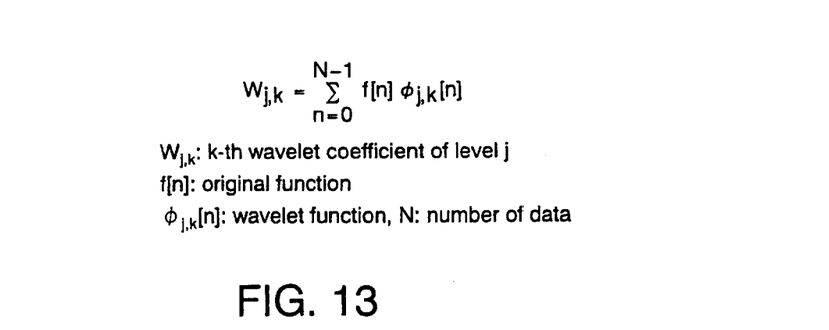
FIG. 13 shows a formula of the wavelet transform used in this invention.
Figure 14:
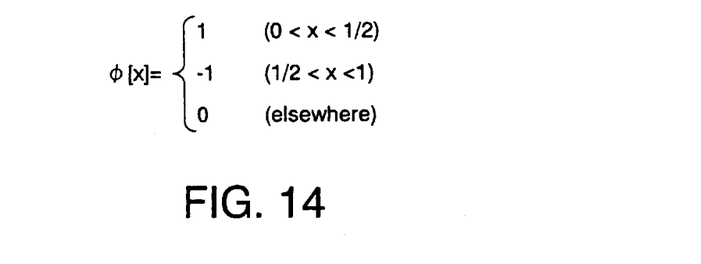
FIG. 14 shows a formula of the Haar function used in this invention.

The wavelet transform is a transform in which an orthonormal function is used as a kernel, like the Fourier transform. The wavelet transform is different from the Fourier transform in that the transform is performed not by a periodic function such as a trigonometric function but by a local function. Herein, the transform is carried out by the use of the Haar function by way of example. The Haar wavelet transform corresponds to a process in which averaging for decreasing the resolution of an image and extraction of a difference between adjacent signals are simultaneously carried out and repeated. The wavelet transform is generally expressed as illustrated in FIG. 13. The Haar function is illustrated in FIG. 14.

Figure 15:
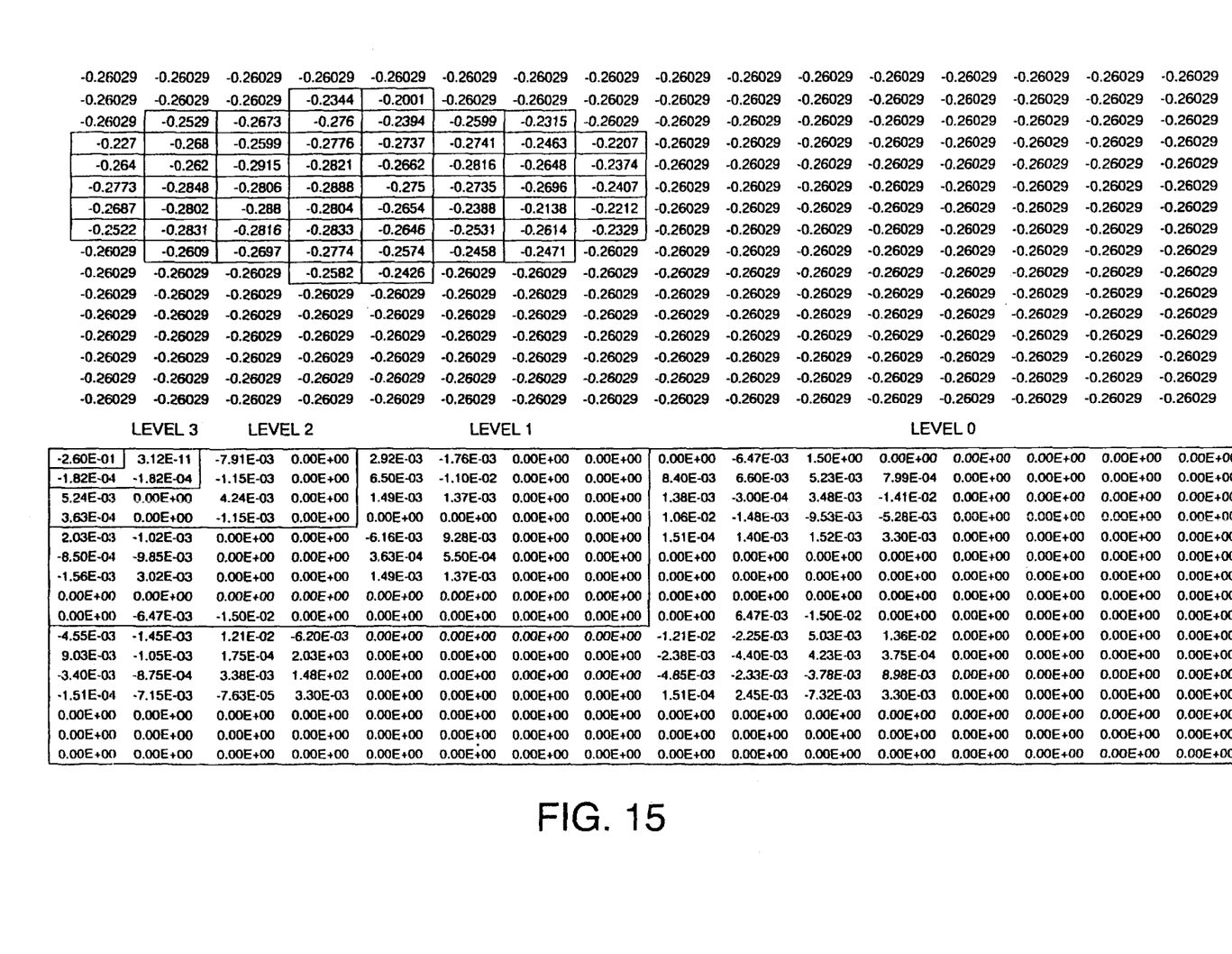
FIG. 15 shows 16×16 matrix data including measured data of threshold values of transistors on a wafer with unmeasurable positions filled with average values and processed data obtained as a result of the wavelet transform of the matrix data.

Referring to FIG. 15, illustrated are measured values of transistor threshold values of 56 chips on the wafer. In order to arrange the data in a 16×16 matrix, gaps are filled with average values. Thereafter, the Haar wavelet transform is carried out. The wavelet transform requires a square grid of a multiple of 2. Therefore, the illustrated example adopts such a method. By filling the gaps with the average values, an influence upon wavelet coefficients of high levels is avoided. If there is an unmeasurable chip due to a trouble in the production process to cause presence of gaps, the gaps are filled with averages of neighborhood chips.

The matrix in the lower half of FIG. 15 is obtained after 4 levels (4 times) of the Haar wavelet transform. Every time when the transform is carried out, a portion extracted as differences is arranged in a lower right ¾ part. An upper left part finally left is an average value.

Figure 16:
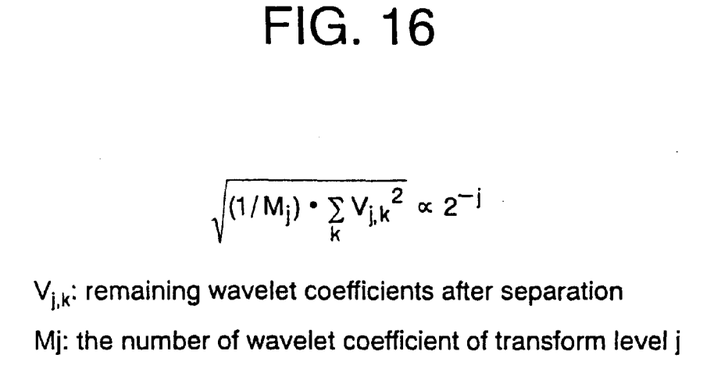
FIG. 16 shows a factor to be compared upon ranking of the wavelet.

Herein, it is recognized that those having transform coefficients large in absolute value are the position dependent variation (corresponding to the image in the image processing) and those having small transform coefficients are random variation (corresponding to the noise in the image processing). Such a technique of decomposing the data with reference to the magnitude of the transform coefficient is a common technique in the image processing. It is assumed here that the random variation has a normal distribution. If the normal distribution is subjected to the Haar wavelet transform, the average of the absolute values of the transform coefficients is great in those of a low level (high-frequency component) and is equal to twice that of a next level. This is because the standard deviation becomes twice when four normal distributions are summed up for averaging. Therefore, in order to compare the transform coefficient in magnitude with one another, use is made of a factor with a weight corresponding to each level added thereto, as illustrated in FIG. 16.

Figure 17:
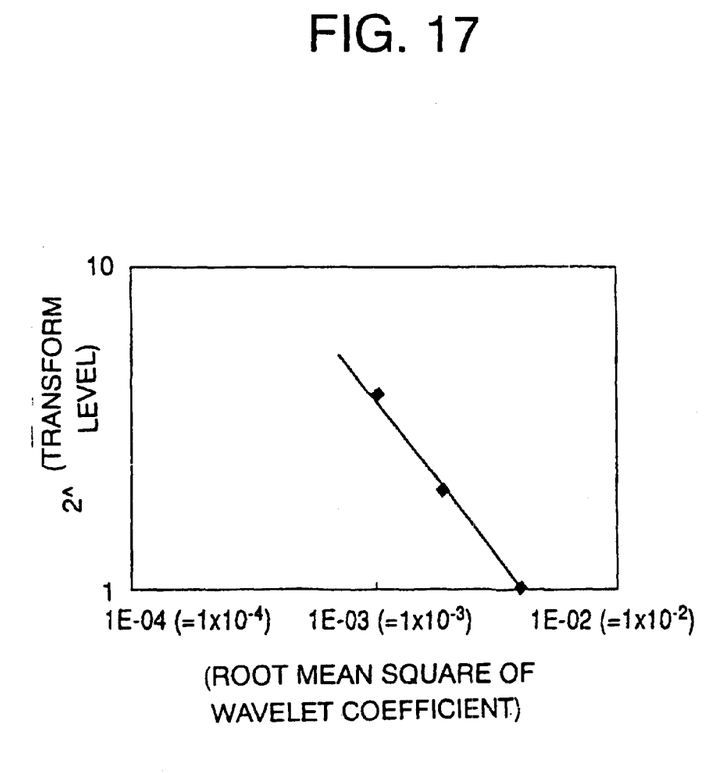
FIG. 17 shows a formula representing the level dependency of a [root] mean square of a wavelet coefficient which is held on the assumption that a random variation has a normal distribution.

For judgment in mode separation, investigation is made of the [root] mean square of the transform coefficient for each transform level. If the remaining distribution after the separation is a normal distribution, the relationship given by a formula illustrated in FIG. 17 holds. If the formula is plotted as illustrated in FIG. 18, the gradient must be equal to −1. Such level dependency of the wavelet coefficient is present in other wavelet transforms (for example, the Daubechies wavelet transform).

In the illustrated data, the remaining distribution after separation of upper 8% of the wavelet coefficients has a gradient close to −1. In addition, the root mean square (RMS) of the coefficients between the level 0 to the level 2 are located on a straight line.

Figure 19A:
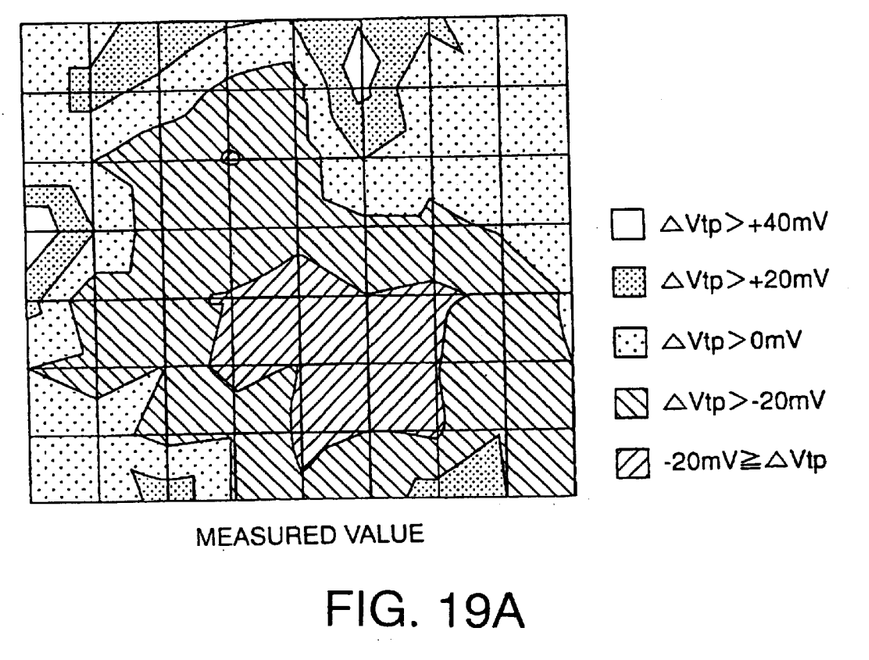
FIGS. 19A and 19B show a contour line chart of measured values and a contour line chart of processed data after restructuring the wavelet coefficients ranked in upper 8%.
Figure 19B:
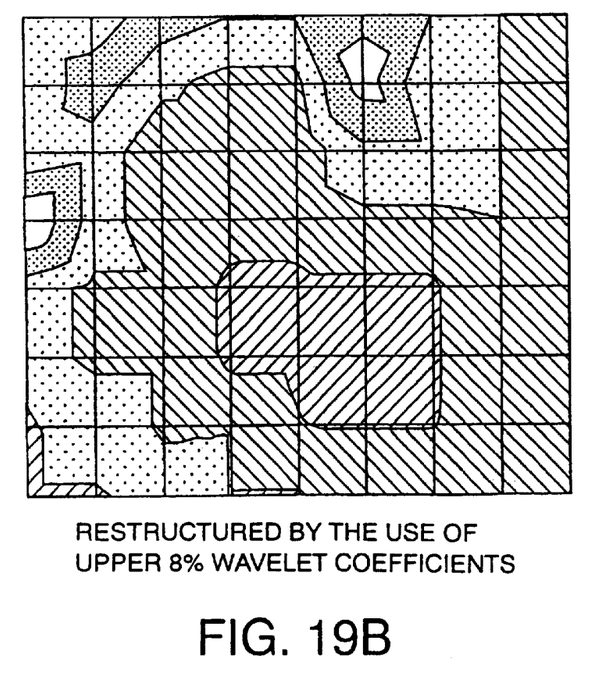

The standard deviation of the measured values is equal to 21 mV. At a 8% separation point specified by the above-mentioned technique, the standard deviation of the position dependent component of the variation is 19.3 mV while the standard deviation of the random component of the variation is 7.5 mV. Referring to FIGS. 19A and 19B, contour line charts represent the original measured data and the processed data obtained by restructuring the upper 8% wavelet coefficients.

By introducing the technique of the image processing, the position dependent mode can be separated in a complicated semiconductor process. In the foregoing, the technique of mode separation of the variation is explained in conjunction with the transistor threshold value. However, this technique is applicable to another device parameter (such as line capacitance, diffusion layer capacitance) on the wafer. Therefore, circuit simulation using these parameters enables mode separation of the variation of the circuit element.

Figure 20:
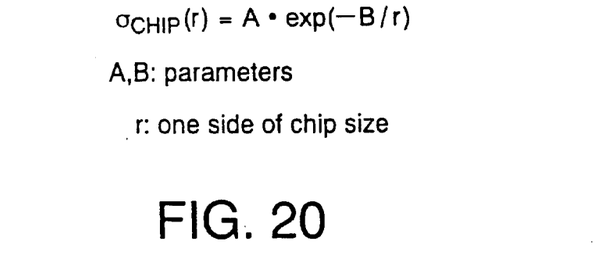
FIG. 20 shows a formula representing the chip size dependency of a position dependent component of the variation.

Next, description will be made of a technique of obtaining $\sigma_{CHIP}$ as a function of a chip size from the wavelet coefficients. Referring to FIG. 20, a simple function is assumed which is saturated when the chip size is increased to a certain extent (becomes equal to a wafer size) and which is equal to 0 when the chip size is equal to 0.

Figure 21:
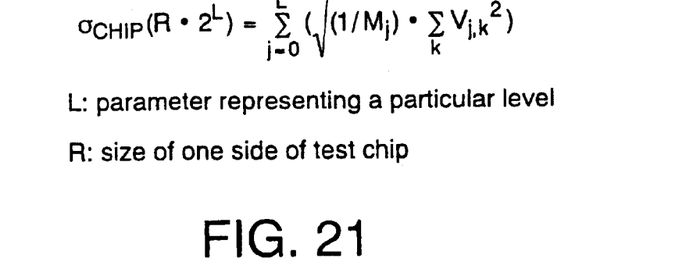
FIG. 21 shows a formula used in calculating the chip size dependency of the position dependent component of the variation by calculating a sum of [root] mean squares of the wavelet coefficients up to a certain level.
Figure 22:
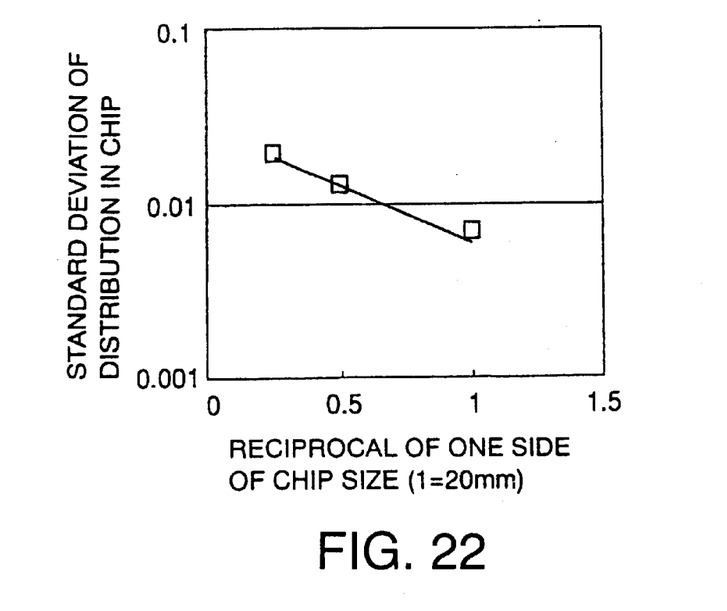
FIG. 22 shows the function of the formula in FIG. 20 with values obtained by the formula in FIG. 21 fitted thereto.

The root mean square of the wavelet coefficients at the level 0 after separating the random variation component represents an average variation between adjacent data of a test chip measured for threshold value data. Therefore, the root mean square can be considered as a standard deviation of the distribution in the test chip. The standard deviation is similarly obtained with respect to the variation in the chip of a chip size twice in length of one side and four times in area and can be represented by a formula illustrated in FIG. 21. The formula is plotted in FIG. 22. In conformity with the formula assumed in FIG. 20, the standard deviations are located on a straight line so that parameters A and B can be obtained. The above-mentioned technique of calculation makes use of the fact that the wavelet coefficients of the Haar wavelet transform are differences between adjacent data.

As described above, according to this invention, the circuit logically synthesized is closer to the optimum circuit in production. Therefore, a high-performance semiconductor device can be obtained. This invention is not restricted to the foregoing embodiments and these embodiments can be appropriately modified within the scope of the technical concept of this invention.

What is claimed is:

1. A library for use in designing a logic circuit of a semiconductor device, said logic circuit comprising a circuit element having signal paths, said library memorizing a delay value for each of the signal paths of said circuit element, wherein said library further memorizes a standard deviation of a variation of said delay value for each of the signal paths of said circuit element.

2. A library as claimed in claim 1, wherein said standard deviation of the variation of said delay value is a standard deviation of a position dependent component of the variation of said delay value for each of the signal paths of said circuit element, said position dependent component being dependent upon a position of said logic circuit within a wafer plane when said logic circuit is formed on said wafer plane as a result of logic synthesis.

3. A library as claimed in claim 2, wherein said standard deviation of the position dependent component of the variation of said delay value is a standard deviation of the position dependent component dependent upon an occupied area of said logic circuit or a length of one side of said logic circuit when said logic circuit is formed on said wafer plane as a result of logic synthesis.

4. A library as claimed in claim 1, wherein said standard deviation of the variation of said delay value is a standard deviation of a random component of the variation of said delay value for each of the signal paths of said circuit element, said random dependent component being independent of a position of said logic circuit within a wafer plane when said logic circuit is formed on said wafer plane as a result of logic synthesis.

5. A library for use in designing a logic circuit of a semiconductor device, said logic circuit comprising a circuit element having signal paths, said library memorizing a delay value for each of the signal paths of said circuit element, wherein said library further memorizes a variance of a variation of said delay value for each of the signal paths of said circuit element.

6. A library as claimed in claim 5, wherein said variance of the variation of said delay value is a variance of a position dependent component of the variation of said delay value for each of the signal paths of said circuit element, said position dependent component being dependent upon a position of said logic circuit within a wafer plane when said logic circuit is formed on said wafer plane as a result of logic synthesis.

7. A library as claimed in claim 6, wherein said variance of the position dependent component of the variation of said delay value is a variance of the position dependent component dependent upon an occupied area of said logic circuit or a length of one side of said logic circuit when said logic circuit is formed on said wafer plane as a result of logic synthesis.

8. A library as claimed in claim 5, wherein said variance of the variation of said delay value is a variance of a random component of the variation of said delay value for each of the signal paths of said circuit element, said random dependent component being independent of a position of said logic circuit within a wafer plane when said logic circuit is formed on said wafer plane as a result of logic synthesis.

9. A computer-readable recording medium which records a library for use in designing a logic circuit of a semiconductor device, said logic circuit comprising a circuit element having signal paths, said library memorizing a delay value for each of the signal paths of said circuit element and a standard deviation of a variation of said delay value for each of the signal paths of said circuit element, said recording medium further recording a program for making a computer execute a logic synthesis operation in which logic synthesis of the logic circuit is carried out by the use of said library.

10. A computer-readable recording medium which records a library for use in designing a logic circuit of a semiconductor device, said logic circuit comprising a circuit element having signal paths, said library memorizing a delay value for each of the signal paths of said circuit element and a variance of a variation of said delay value for each of the signal paths of said circuit element, said recording medium further recording a program for making a computer execute a logic synthesis operation in which logic synthesis of the logic circuit is carried out by the use of said library.

11. A method of designing a semiconductor device, comprising the steps of:

preparing a library for use in designing a logic circuit of said semiconductor device, said logic circuit comprising a circuit element having signal paths, said library memorizing a delay value for each of the signal paths of said circuit element and a standard deviation of a variation of said delay value for each of the signal paths of said circuit element; and carrying out logic synthesis of said logic circuit by the use of said library.

12. A method of designing a semiconductor device, comprising the steps of:

preparing a library for use in designing a logic circuit of said semiconductor device, said logic circuit comprising a circuit element having signal paths, said library memorizing a delay value for each of the signal paths of said circuit element and a variance of a variation of said delay value for each of the signal paths of said circuit element; and carrying out logic synthesis of said logic circuit by the use of said library.

13. A method of preparing a library for use in designing a logic circuit of said semiconductor device, said logic circuit comprising a circuit element having signal paths, said library memorizing a delay value for each of the signal paths of said circuit element, a first variance of a position dependent component of a variation of said delay value for each of the signal paths of said circuit element, and a second variance of a random component of the variation of said delay value for each of the signal paths of said circuit element, said position dependent component being dependent upon a position of said logic circuit within a wafer plane when said logic circuit is formed on said wafer plane as a result of logic synthesis, said random dependent component being independent of the position of said logic circuit within said wafer plane when said logic circuit is formed on said wafer plane as a result of logic synthesis, said method comprising the step of:

separating a device parameter of said semiconductor device to be designed into said position dependent component and said random component by wavelet transform to obtain said first and said second variances.

14. A method as claimed in claim 13, wherein separation of said device parameter into said position dependent component and said random component by the wavelet transform is carried out based on judgment utilizing transform level dependency of a wavelet coefficient.

15. A method as claimed in claim 14, wherein the wavelet transform is carried out by the use of the Haar function.

16. A method as claimed in claim 13, wherein the wavelet transform compensates data at an unmeasurable position with any one of an average of overall data and an average of neighborhood data.

* * * * *